(12) United States Patent
Breeden et al.

(10) Patent No.: US 12,154,787 B2
(45) Date of Patent: Nov. 26, 2024

(54) METHODS OF PERFORMING SELECTIVE LOW RESISTIVITY Ru ATOMIC LAYER DEPOSITION AND INTERCONNECT FORMED USING THE SAME

(71) Applicant: The Regents of the University of California, Oakland, CA (US)

(72) Inventors: Michael Breeden, La Jolla, CA (US); Victor Wang, La Jolla, CA (US); Andrew Kummel, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 191 days.

(21) Appl. No.: 17/544,994

(22) Filed: Dec. 8, 2021

(65) Prior Publication Data

US 2022/0189763 A1 Jun. 16, 2022

Related U.S. Application Data

(60) Provisional application No. 63/123,769, filed on Dec. 10, 2020.

(51) Int. Cl.
*H01L 21/02* (2006.01)
*H01L 21/768* (2006.01)
*H01L 23/532* (2006.01)

(52) U.S. Cl.
CPC ......... *H01L 21/0262* (2013.01); *H01L 21/76879* (2013.01); *H01L 23/53242* (2013.01)

(58) Field of Classification Search
CPC ............ C23C 16/18; C23C 16/45525; C23C 16/40; C23C 16/56; C23C 16/45553; H01L 21/0262; H01L 21/28562; H01L 21/32051; H01L 21/76879; H01L 23/53242

See application file for complete search history.

(56) References Cited

U.S. PATENT DOCUMENTS

| 7,074,719 B2 | 7/2006 | Kim et al. |
|---|---|---|
| 2005/0070041 A1 | 3/2005 | Wu et al. |
| 2010/0003406 A1 | 1/2010 | Lam et al. |
| 2019/0185993 A1* | 6/2019 | Chen ............... C23C 16/04 |

OTHER PUBLICATIONS

Chen et al. (2000) Thin Solid Films 376, 115.
Josell et al. (2009) Ann. Rev. Mater. Res. 39, 231.
Gall (2016) J. Appl. Phys. 119, 085101.
Kwak et al. (1999) Thin Solid Films 339, 290.
Lane et al. (2011) J. Mater. Res. 15, 203.
(Continued)

*Primary Examiner* — Tony Tran
(74) *Attorney, Agent, or Firm* — Stanek Lemon Crouse & Meeks PA

(57) ABSTRACT

Provided by the inventive concept are methods for fabricating semiconductor devices, such as methods of atomic layer deposition (ALD). Aspects of the inventive concept include methods for depositing and forming Ru metal layers having low resistivity, forming Ru metal layers without the need for a post-deposition annealing step, forming Ru metal layers selectively on portions of a substrate without the need for passivation, and providing Ru metal layers for use in back end of the line (BEOL) applications in semiconductor devices that do not require a liner/barrier layer.

12 Claims, 13 Drawing Sheets

(56) References Cited

OTHER PUBLICATIONS

Van der Veen et al. (2018) Proc. of the IITC 2018 DOI: 10.1109/IITC.2018.8430407.
Pedreira et al. (2017) IEEE IRPS 2017 DOI: 10.1109/IRPS.2017.7936340.
Murdoch et al. (2020) IEEE IITC 2020 DOI: 10.1109/IITC47697.2020.9515597.
Lee et al. (2003) Mater. Chem. and Phys. 82, 984.
Green et al. (1985) J. Elec. Soc. 132, 2677.
Khan et al. (2019) Chem. Mater. 30, 7603.
Mackus et al. Chem. Mater. (2019) 31, 2.
Aaltonen et al. Chem. Vap. Depos. (2003) 9, 45.
Kim et al. (2009) J. Korean Phys. Soc. 55, 32.
Popovici et al. Chem. Mater. (2017) 29, 4654.
Yim et al. (2008) J. Appl. Phys. 103, 113509.
Gao et al. (2019) Chem. Mater. 31, 1304.
Hayes et al. (2021) J. Vac. Sci. A 39, 052402.
Wolf et al. (2020) Appl. Surf. Sci. 510, 144804.
Scofield (1976) J. Elec Spectroscopy and Rel. Pheno. 8, 129.
Morgan (2015) Surf. Interface Anal. 47, 1072.
Perloff (1977) Solid-State Elec. 20, 681.
Patterson (1939) Phys. Rev. 56, 978.
Jog and Gall (2021) J. Appl. Phys. 130, 115103.
Jog and Gall (2022) IEEE Trans Elec. Dev. 69, 3854.
Milosevic et al. (2018) J. Appl. Phys. 124, 165105.
Milosevic (2019) J. Appl. Phys. 125, 245105.
Cumpson Surf. Interface Anal. 29, 403.
Powell et al. (1967) J. Less. Common Met. 12, 1.
Moretti 1993) Surf. Interface Anal. 20, 681.
Damayanti et al. (2007) Electrochem. and Solid State Lett. 10, p. 15.
Solina et al. (1997) Adv. X-ray Anal. 40.
Tang and Hess (1984) J. Electrochem Sco . . . 131, 115.
D. Gall. The Search for the Most Conductive Metal for Narrow Interconnect Lines. Journal of Applied Physics. 127, 050901 (2020).
S. Dutta, K. Sankaran, K. Moors, G. Pourtois, S. Elshocht, J.Bommels, W.Vandervorst, Z. Tokei, C. Adelmann. Thickness Depenence of the Resistiity of Platinum-group Metal Thin Films. Journal of Applied Physics. 122, 025107 (2017).
T. Hung, S, Choi, S. Yeo, J. Park, S. Kim, T. Cheon, H. Kim M. Kim, H. Kim. Atomic Layer Deposition of Ru Thin Films Using a Ru(0) Metallorganic Precursor and O2. ECS Journal of Solid State Science and Technology. 2(3) p. 47-p. 53 (2013).
M. H. Hayes, J.F. Conley Jr. Properties of Annealed ALD Ru from Ru(DMBD)(CO)3 and Oxygen. ECS Meeting Abstrcts, vol. MA2018-01 (2018).
D. Kwon, C. An, S. Kim, D. Kim, J. Lim, W. Jeon, C. Hwang. Atomic Layer Deposition of Ru Thin Films Using (2,3-imethyloxopentaienyl) (ethycyclopentadienyl)Ru and the Effect of Ammonia Tratment during the Deposition. Journal of Materials Chemistry C. Issue 21, (2020).
I. Zyulkov, M. Krishtab, S. Gendt, S. Armini. Selective Ru ALD as a Catalyst for Sub-Seven-Nanometer Bottom-Up Metal Interconnects. ACS Applied Materials & Interfaces. 9, 31031-31041 (2017).
H. Wang, R. Gordon, R. Alvis, R. M. Ulfig. Atomic Layer Deposition of Ruthenium Thin Films from Amidinate Precursor. Chemical Vapor Deposition, 15, 312-319 (2009).
T. Aaltonen, A. Rahtu, M. Rital, M. Leskela. Reaction Mechanism Studies on Atomic Layer Deposition of Ruthenium and Platinum. Electrochemical and Solid-State Letters 6(0): C130 (2003).
T. Aaltonen, M. Ritala, K. Arstila, J. Keinonen, M. Leskela. Atomic Layer Deposition of Ruthenium Thin Films from Ru(thd)3 and Oxygen. Chemical Vapor Deposition, 10(4), 215-219 (2004).
H. Kim, S. Rossnagel. ALD Deposition of Ruthenium. International Business Machines Corporation. U.S. Pat. No. 7,074,719 B2. 2006.
S. Cwik, K. Woods, M. Saly, T. Knisley, C.H. Winter. Thermal Atomic Layer Deposition of Ruthenium Metal Thin Films using Nonoxidative Coreactants. Journal of Vacuum Science &Technology A38, 012402(2020).
O. Kwon, J. Kim, H. Park, S. Kang. Atomic Layer Deposition of Ruthenium Thin Films for Copper Glue Layer. Journal of Electrochemical Society, 151(2) G109-G112 (2004).
M. Leskela, M. Ritala. Atomic Layer Deposition Chemistry: Recent Developments and Future Challenges. Angewandte Chemie International Edition, 42 (45). (2003).
Moriarty, John L., Journal of Chemical and Engineering Data 62, p. 422 (1963).
Wolf, et al., Low temperature thermal ALD TaNx and TiNx films from anhydrous N2H4, Applied Surface Science, Dec. 31, 2018, vol. 462, pp. 1029-1035.
Stevens, et al., Area-Selective Atomic Layer Deposition of TiN, TiO2, and HfO2 on Silicon Nitride with inhibition on Amorphous Carbon, Chemistry of Materials, Apr. 27, 2018, vol. 30 issue 10, pp. 3223-3232, DOI: 10.1021/acs.chemmater.8b00017.
Lee, et al., Alternative Surface Reaction Route in the Atomic Layer Deposition of Titanium Nitride Thin Films for Electrode Applications, ACS Applied Electronic Materials, Feb. 5, 2021, vol. 3 issue 2, pp. 999-1005, DOI: 10.1021 /acsaelm.0c01079.
Elam, et al., Surface chemistry and film growth during TiN atomic layer deposition using TDMAT and NH3, Thin Solid Films, Jul. 31, 2003, vol. 436 issue 2, pp. 145-156, DOI: 10.1016/S0040-6090(03)00533-9.
Wang, et al., Atomic Vapor Deposition of TiN with Diluted Tetrakis (diethylamido) Titanium (TDEAT) for Phase Change Memory, ECS Transactions, 2009, vol. 22 issue 1, pp. 167-173, DOI:10.1149/1.3152973.
Chen, et al., Plasma-Enhanced Atomic Layer Deposition (PEALD) of TiN using the Organic Precursor Tetrakis(ethylmethylamido) Titanium (TEMAT), MATEC Web of Conferences, Jan. 13, 2016, vol. 39, article No. 01010, DOI: 10.1051/matecconf/20163901010.
Musschoot, et al., Atomic layer deposition of titanium nitride from TDMAT precursor, Microelectronic Engineering, Jan. 2009, vol. 86 issue 1, pp. 72-77, DOI: 10.1016/j.mee.2008.09.036.
Hao, et al., Study on influences of TiN capping layer on time-dependent dielectic breakdown characteristic of ultra-thin EOT high-k metal gate NMOSFET with kMC TDDB simulations, Chinese Physics B, 2016, vol. 25 issue 8, article No. 087305, DOI: 10.1088/1674-1056/25/8/087305.
O. Kwon et al., "Atomic Layer Deposition of Ruthenium Thin Films for Copper Glue Layer," Journal of Electrochemical Society, 151(2) G109-G112 (2004).
Moriarty, John L.; "Vapor Pressures of Yttrium and Rare Earth Chlorides Above Their Melting Points", Journal of Chemical and Engineering Data 62, p. 422 (1963).
M. Leskela et al.; "Atomic Layer Deposition Chemistry: Recent Developments and Future Challenges", Angewandte Chemie International Edition, 42 (45). (2003).
S. Cwik, et al.; "Thermal Atomic Layer Deposition of Ruthenium Metal Thin Films using Nonoxidative Coreactants", Journal of Vacuum Science and Technology A38, 012402 (2020).
T. Aaltonen et al.; "Atomic Layer Deposition of Ruthenium Thin Films from Ru(thd)3 and Oxygen", Chemical Vapor Deposition, 10(4), 215-219 (2004).
Dutta et al.; "Thickness dependence of teh resistivity of platinum-group metal thin films", (2017) J. Appl. Phys. 122, 025107.
Gall, Daniel; "The search for the most conductive metal for narrow interconnect lines", (2020) J. Appl. Phys. 127, 050901.

* cited by examiner

METHODS OF PERFORMING SELECTIVE LOW RESISTIVITY Ru ATOMIC LAYER DEPOSITION AND INTERCONNECT FORMED USING THE SAME

CROSS REFERENCE TO RELATED APPLICATION

This application claims priority to U.S. Provisional Application Ser. No. 63/123,769, filed Dec. 10, 2020, the disclosure of which is incorporated herein by reference in its entirety.

FIELD

The inventive concept relates to semiconductor device fabrication and atomic layer deposition methods in semiconductor device fabrication. Aspects of the inventive concept include methods for forming interconnect lines for integrated circuits, and methods for forming vias for integrated circuits that serve as liners for BEOL interconnects.

BACKGROUND

Ruthenium (Ru) metal has been identified as a candidate material for interconnect lines due to its promise for low resistivities at narrow pitches. Ru metal atomic layer deposition (ALD) has been investigated due to the requirements for conformality and thickness control for interconnect deposition. At present, resistivity values from Ru metal films grown by ALD have been higher than that of their physical vapor deposition (PVD) grown counterparts.

In deeply scaled interconnects employed in front end of line (FEOL) and middle end of the line (MEOL) applications, copper (Cu) requires barrier layers, which ends up increasing its resistivity due to scattering. Liner/barrier layer thickness is a critical parameter that strongly affects the line resistance of narrow interconnects. For example, the conductance of a 10 nm metal line that does not require a liner/barrier layer is expected to outperform the conductance of a metal that has a 2× lower resistivity but requires a 2 nm liner (Gall, (2020) J. Appl. Phys. 127, 050901). Ru metal, at narrow pitches, exhibits comparable resistivity to Cu and does not require a liner/barrier layer.

PVD methods for depositing Ru metal films have yielded the lowest resistivity values in literature, below 10 µΩ·cm, and processes that can deposit an Ru film with a resistivity approaching that of bulk Ru (~7 µΩ·cm) are being sought. A drawback to PVD methods is that there is less control over thickness due to the higher growth rates for PVD processes, and that PVD processes do not yield a conformal deposition, especially for applications in via filling. On the other hand, ALD of Ru metal films have yielded conformal deposition with a low growth rate, but these processes do not yield low resistivity Ru metal films near or below 9.5 µΩ·cm. While Ru metal films prepared by ALD having resistivities below 10 µΩ·cm have been reported (Hayes et al. (2021) J. Vac. Sci. Technol. A 39, 052402), post-deposition annealing (PDA) at 500° C. in $H_2/N_2$ gas is required, and surface roughness increased as a result of the PDA. Furthermore, while some work on Ru ALD have demonstrated selective deposition, passivation has generally been a necessary step in these processes.

Ru PVD processes lack both substrate selectivity and deposition conformality. Meanwhile, Ru ALD processes have only produced high resistivity films without PDA. PDA has been used to lower film resistivities, but ALD grown Ru films have not yielded resistivities near or lower than 9.5 µΩ·cm without PDA, and/or in combination with substrate selectivity without surface treatment and/or passivation.

SUMMARY

According to an aspect of the inventive concept, provided is a method for atomic layer deposition (ALD) of Ruthenium (Ru) on a substrate including at least one cycle of: exposing a surface of a substrate to a chemical precursor comprising Ru; depositing the chemical precursor on the surface of the substrate; and exposing the chemical precursor on the surface of the substrate to a co-reactant, to provide an Ru film on the surface of the substrate.

According to another aspect of the inventive concept, provided is a method for ALD of Ru on a substrate including at least one cycle of: exposing a surface of a substrate to a chemical precursor comprising $Ru(IHD)(CO)_2$ (bis(5-methyl-2,4-hexanediketonato) Ru(II), "Ru-Carish"); depositing the chemical precursor on the surface of the substrate; and exposing the chemical precursor on the surface of the substrate to a co-reactant including $O_2$, to provide an Ru film on the surface of the substrate.

According to another aspect of the inventive concept, provided is a method for ALD of Ru on a substrate including at least one cycle of: exposing a surface of a substrate to a chemical precursor including $Ru(EtCp)_2$; depositing the chemical precursor on the surface of the substrate; and exposing the chemical precursor on the surface of the substrate to a co-reactant including $O_2$, to provide an Ru film on the surface of the substrate.

Further aspects of the inventive concept include films/layers prepared by the methods described herein, and semiconductor devices including films/layers prepared by the methods described herein.

DETAILED DESCRIPTION

Figure 1:
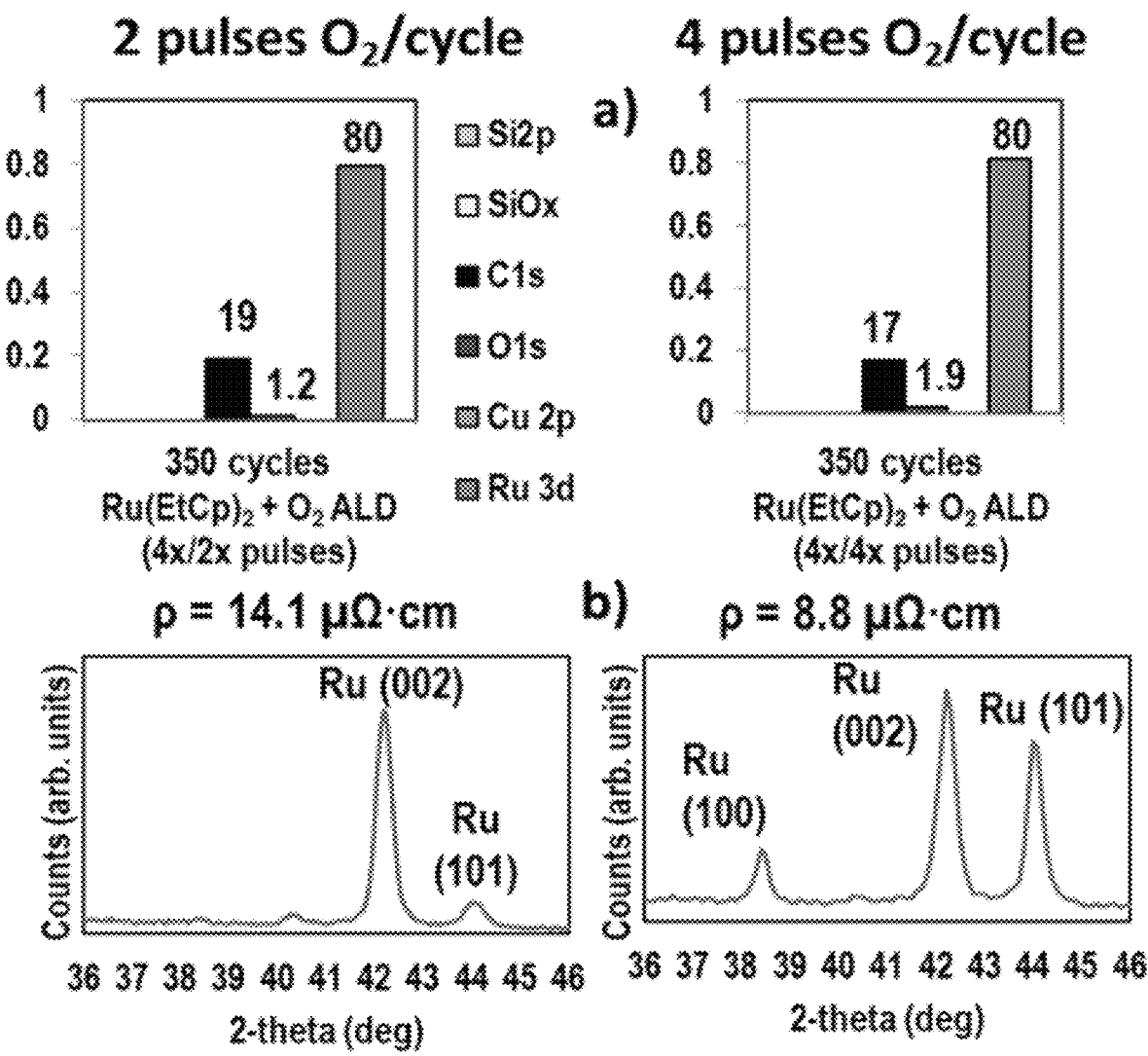
FIG. 1. Resistivity-oxygen dose relationship for Ru ALD using $Ru(EtCp)_2$. At 2 pulses/cycle, growth rate was 0.9 Å/cycle, while at 4 pulses/cycle, growth rate was 1.0 Å/cycle. a) Oxygen content of both films was sub 2%, with the 2 pulse and 4 pulse/cycle films having a resistivity of 14.1 and 8.8 µΩ·cm, respectively. b) XRD and XRR of the films shows that the Ru(002) peak is dominant, but the Ru(101) grain size increases from 18.4 nm to 28.0 nm.

The foregoing and other aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

The term "comprise," as used herein, in addition to its regular meaning, may also include, and, in some embodiments, may specifically refer to the expressions "consist essentially of" and/or "consist of." Thus, the expression "comprise" can also refer to, in some embodiments, the specifically listed elements of that which is claimed and does not include further elements, as well as embodiments in which the specifically listed elements of that which is claimed may and/or does encompass further elements, or embodiments in which the specifically listed elements of that which is claimed may encompass further elements that do not materially affect the basic and novel characteristic(s) of that which is claimed. For example, that which is claimed, such as a composition, formulation, method, system, etc. "comprising" listed elements also encompasses, for example, a composition, formulation, method, kit, etc. "consisting of," i.e., wherein that which is claimed does not include further elements, and a composition, formulation, method, kit, etc. "consisting essentially of," i.e., wherein that which is claimed may include further elements that do not materially affect the basic and novel characteristic(s) of that which is claimed.

The term "about" generally refers to a range of numeric values that one of skill in the art would consider equivalent to the recited numeric value or having the same function or result. For example, "about" may refer to a range that is within ±1%, ±2%, ±5%, ±7%, ±10%, ±15%, or even ±20% of the indicated value, depending upon the numeric values that one of skill in the art would consider equivalent to the recited numeric value or having the same function or result. Furthermore, in some embodiments, a numeric value modified by the term "about" may also include a numeric value that is "exactly" the recited numeric value. In addition, any numeric value presented without modification will be appreciated to include numeric values "about" the recited numeric value, as well as include "exactly" the recited numeric value. Similarly, the term "substantially" means largely, but not wholly, the same form, manner or degree and the particular element will have a range of configurations as a person of ordinary skill in the art would consider as having the same function or result. When a particular element is expressed as an approximation by use of the term "substantially," it will be understood that the particular element forms another embodiment.

The term "substrate," as used herein, can broadly refer to any layer and/or surface upon which processing is desired. Thus, for example, a native oxide film on the surface of a silicon substrate may itself be considered a substrate for the purposes of this discussion. Likewise, layers deposited on silicon or on other base substrates may likewise be considered substrates in some embodiments. For example, in some embodiments, a multi-layer stack may be formed, and then atomic layer deposition and/or atomic layer annealing may be performed on the top layer, or a surface of the top layer, of the stack. In such a case, the top layer may be considered the substrate. In general, the layer or layers upon which the chemical precursor is deposited and/or which reacts with the chemical precursor can be considered the substrate layer(s). The material for the substrate may be any that may be appreciated by one of skill in the art in the field of electronics and/or semiconductors.

The term "atomic layer deposition" (ALD), as used herein, can broadly refer to the level of layer dimensional control that can be achieved at the angstrom (Å) level. Thus, atomic layer deposition may generally correspond to the size of atoms and/or molecules. The average added layer thickness per cycle of ALD can be less than 1 Å (0.1 nm) per deposition cycle, for example, about 0.5 Å, about 0.6 Å, about 0.7 Å, about 0.8 Å, about 0.9 Å, about 1 Å, or more than 1 Å, for example, about 1.1 Å, about 1.2 Å, about 1.3 Å, about 1.4 Å, about 1.5 Å, about 2 Å, about 2.5 Å, about 3 Å, about 4 Å, about 5 Å, about 6 Å, about 7 Å, about 8 Å, about 9 Å, about 10 Å (1 nm), or any number between about 0.1-30 Å per deposition cycle. In some embodiments, the average added layer thickness per cycle is between about 0.1-4 Å, about 0.5-4 Å per deposition cycle, about 0.6-4 Å, about 0.7-4 Å per deposition cycle, about 0.8-4 Å per deposition cycle, about 0.9-4 Å per deposition cycle, or about 1-4 Å per deposition cycle. Similarly, the number of deposition cycles in the ALD process is not particularly limited, and may be any number of cycles that would be appreciated by one of skill in the art. For example, the number of deposition cycles in the process may be between 1 and about 1,000 cycles. In some embodiments, the number of deposition cycles may be between about 1-600 cycles, for example, 1 cycle, about 5 cycles, about 10 cycles, about 20 cycles, about 30 cycles, about 40 cycles, about 50 cycles, about 75 cycles, about 100 cycles, about 150 cycles, about 200 cycles, about 250 cycles, about 300 cycles, about 350 cycles, about 400 cycles, about 450 cycles, about 500 cycles, about 550 cycles, or about 600 cycles, or any number of deposition cycles between and including 1 deposition cycle and about 1,000 deposition cycles. According to some embodiments, a deposition cycle may include exposing the substrate to a pulse, or more than one pulse, for example, 2, 3, 4, 5, 6 pulses, etc. of a chemical precursor, and a pulse, or more than one pulse, for example, 2, 3, 4, 5, 6 pulses, etc. of a co-reactant.

The term "selective deposition," as used herein, may refer to preferential deposition of a layer, such as the films/layers described herein, on, for example, a substrate including more than one portion, on a first portion of the substrate, over a second portion, or portions, of the substrate. In some embodiments, selective deposition on the first portion may be about an order of magnitude (10-fold) greater than that on the second portion or portions of the substrate. In some embodiments, selective deposition on the first portion may be about greater than an order of magnitude (10-fold) greater, for example, about, or greater than about 20-fold greater, about, or greater than about 25-fold greater, about, or greater than about 30-fold greater, about, or greater than about 35-fold greater, about, or greater than about 40-fold greater, about, or greater than about 45-fold greater, about, or greater than about 50-fold greater, about, or greater than about 60-fold greater, about, or greater than about 70-fold greater, about, or greater than about 80-fold greater, about, or greater than about 90-fold greater, about, or greater than about 100-fold greater, about, or greater than about 200-fold greater, about, or greater than about 500-fold greater, or about, or greater than about 1,000-fold greater than that on the second portion or portions of the substrate. In some embodiments, selective deposition on the first portion of the substrate may show little or no, or substantially no deposition on the second portion or portions of the substrate.

Unless otherwise defined, all technical and scientific terms used herein have the same meaning as commonly understood by one of ordinary skill in the art to which this invention belongs.

Embodiments of the present inventive concept relate to methods, systems and materials pertaining to Ru metal atomic layer deposition (ALD) processes using, for example, Ru-Carish (Ru(IHD)(CO)$_2$) and Ru(EtCp)$_2$ respectively to yield resistivity values comparable to sputtered Ru metal films (near or below about 10 μΩ·cm). In some embodiments, processes of the inventive concept use an about 10% O$_2$/He mixture as the co-reactant at a deposition temperature of 300° C. Ex-situ four-point-probe measurement in combination with XRR was employed for resistivity characterization.

It will be appreciated that temperatures at which methods of deposition of films/layers of the inventive concept are carried out are not particularly limited, however, the temperatures should be such that the methods of deposition are compatible with, for example, back end of line (BEOL) processing and integration. For example, temperatures at which methods of the inventive concept are carried out may at temperatures of about 250° C., 300° C., 350° C., 400° C., 450° C., etc. Similarly, pressure at which methods of deposition of films/layers of the inventive concept are carried out are not particularly limited, and may be carried out at pressures of about 2 Torr, 1 Torr, 0.1 Torr, $10^{-2}$ Torr, $10^{-3}$ Torr, etc.

The inventive concept also relates to a selective ALD process that does not require passivant and that yields low resistivity Ru metal films and eliminates the need for patterning of the films after deposition. In some embodiments, Ru metal films with resistivities near or below about 10 μΩ·cm, for example, below about 11.0 μΩ·cm, below about 10.9 μΩ·cm, below about 10.8 μΩ·cm, below about 10.7 μΩ·cm, below about 10.6 μΩ·cm, below about 10.5 μΩ·cm, below about 10.4 μΩ·cm, below about 10.2 μΩ·cm, below about 10.1 μΩ·cm, below about 10.0 μΩ·cm, below about 9.9 μΩ·cm, below about 9.8 μΩ·cm, below about 9.7 μΩ·cm, below about 9.6 μΩ·cm, below about 9.5 μΩ·cm, below about 9.4 μΩ·cm, below about 9.3 μΩ·cm, below about 9.2 μΩ·cm, below about 9.1 μΩ·cm, below about 9.0 μΩ·cm, below about 8.9 μΩ·cm, or about 8.8 μΩ·cm, are provided by the inventive concept, and may be limited by that of the resistivity of bulk Ru (~7 μΩ·cm). In some embodiments, the deposited layer has a resistivity near or below about 11.0 μΩ·cm, below about 10.9 μΩ·cm, below about 10.8 μΩ·cm, below about 10.7 μΩ·cm, below about 10.6 μΩ·cm, below about 10.5 μΩ·cm, below about 10.4 μΩ·cm, below about 10.2 μΩ·cm, below about 10.1 μΩ·cm, below about 10.0 μΩ·cm, below about 9.9 μΩ·cm, below about 9.8 μΩ·cm, below about 9.7 μΩ·cm, below about 9.6 μΩ·cm, below about 9.5 μΩ·cm, below about 9.4 μΩ·cm, below about 9.3 μΩ·cm, below about 9.2 μΩ·cm, below about 9.1 μΩ·cm, below about 9.0 μΩ·cm, below about 8.9 μΩ·cm, below about 8.8 μΩ·cm, below about 8.7 μΩ·cm, below about 8.6 μΩ·cm, below about 8.5 μΩ·cm, below about 8.4 μΩ·cm, below about 8.3 μΩ·cm, below about 8.2 μΩ·cm, below about 8.1 μΩ·cm, below about 8.0 μΩ·cm, below about 7.9 μΩ·cm, below about 7.8 μΩ·cm, below about 7.7 μΩ·cm, below about 7.6 μΩ·cm, below about 7.5 μΩ·cm, below about 7.4 μΩ·cm, below about 7.3 μΩ·cm, below about 7.2 μΩ·cm, below about 7.1 μΩ·cm, below about 7.0 μΩ·cm, below about 6.9 μΩ·cm, below about 6.8 μΩ·cm, below about 6.7 μΩ·cm, below about 6.6 μΩ·cm, or even below about 6.5 μΩ·cm, prepared without PDA and/or does not require a liner/barrier layer. In some embodiments, the range of resistivity of films prepared according to methods of the inventive concept may be in the range of about 6-11 μΩ·cm, about 6-10.8 μΩ·cm, about 6-10.5 μΩ·cm, about 6-10.3 μΩ·cm, about 6-10.0 μΩ·cm, about 6-9.8 μΩ·cm, about 6-9.5 μΩ·cm, about 6.5-11 μΩ·cm, about 6.5-10.8 μΩ·cm, about 6.5-10.5 μΩ·cm, about 6.5-10.3 μΩ·cm, about 6.5-10.0 μΩ·cm, about 6.5-9.8 μΩ·cm, about 6.5-9.5 μΩ·cm, about 7-11 μΩ·cm, about 7-10.8 μΩ·cm, about 7-10.5 μΩ·cm, about 7-10.3 μΩ·cm, about 7-10.0 μΩ·cm, about 7-9.8 μΩ·cm, or about 7-9.5 μΩ·cm, prepared without PDA and/or does not require a liner/barrier layer.

In some embodiments, Ru ALD processes of the inventive concept preferentially and/or selectively nucleate, for example, on SiO$_2$, such as degreased SiO$_2$ surface/portion of a substrate over an Si surface/portion of a substrate, such as an HF-cleaned Si surface/portion of a substrate, thus providing a selectively deposited Ru metal film on, for example, $SiO_2$ over Si, without the use of passivants, and/or without a post-deposition annealing (PDA) step/process. In some embodiments, Ru ALD processes of the inventive concept can preferentially and/or selectively nucleate, for example, on an $SiO_2$ surface/portion of a substrate preferentially over an SiCOH surface/portion of a substrate, thus providing a selectively deposited Ru metal film on, for example, $SiO_2$ over SiCOH, without the use of passivants, and/or without a PDA step/process. In some embodiments, Ru ALD processes of the inventive concept preferentially and/or selectively nucleate, for example, on an $SiO_2$ surface/portion of a substrate preferentially over a passivated $SiO_2$ surface/portion of a substrate, such as $SiO_2$ passivated with bis(N, N-dimethylamino)dimethylsilane (DMADMS), thus providing a selectively deposited Ru metal film on, for example, $SiO_2$ over a DMADMS-treated $SiO_2$, without a PDA step/process.

In some embodiments, provided are films, for example, Ru films, having a thickness of at least about 5 nm, 7 nm, 10 nm, 15 nm, 17 nm, 20 nm, 23 nm, 25 nm, 27 nm, 30 nm, 33 nm, 35 nm, 37 nm, 40 nm, 45 nm, 50 nm, 55 nm, 60 nm, 65 nm, 70 nm, 75 nm, 80 nm, 85 nm, 90 nm, 95 nm, 100 nm, 110 nm, 120 nm, or about 130 nm, or any thickness between about 10-130 nm, between about 15-130 nm, between about 20-130 nm, between about 25-130 nm, between about 30-130 nm, between about 10-100 nm, between about 15-100 nm, between about 20-100 nm, between about 25-100 nm, between about 30-100 nm, between about 10-80 nm, between about 15-80 nm, between about 20-80 nm, between about 25-80 nm, between about 30-80 nm, between about 10-60 nm, between about 15-60 nm, between about 20-60 nm, between about 25-60 nm, or between about 30-60 nm. In some embodiments, provided are films having an average crystal/grain size of greater than about 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 37 nm, 40 nm, 42 nm, 45 nm etc., or films having an average crystal/grain size in a range of about 20-50 nm, or films with an average crystal/grain size greater than about 20-50 nm. In some embodiments, the average crystal/grain size is about the same dimension as the thickness of the deposited film. In some embodiments, the average crystal/grain size may be of a greater dimension than the thickness of the film.

Embodiments of the inventive concept encompass films/layers prepared by the methods of the inventive concept as described herein. Films prepared by the methods of the inventive concept may be used in the manufacture/fabrication of semiconductor devices. Accordingly, semiconductor devices including films, for example, Ru metal films, prepared according to the methods as described herein, are encompassed by the inventive concept. In some embodiments, films/layers prepared by methods of the inventive concept may be used in forming, for example, lines/interconnects for FEOL, MEOL, and/or BEOL applications in semiconductor devices, wherein the lines/interconnects do not require including a liner/barrier layer to achieve the resistivities as set forth herein. In some embodiments, films/layers prepared by methods of the inventive concept may be used in forming, for example, lines/interconnects for FEOL, MEOL, and/or BEOL applications in semiconductor devices, wherein the lines/interconnects may be selectively formed on portions/layers in the semiconductor device without the need of a passivant and/or post-deposition patterning. In some embodiments, films/layers prepared by methods of the inventive concept may be used in forming lines/interconnects for FEOL, MEOL, and/or BEOL applications in semiconductor devices, wherein the lines/interconnects may be selectively formed without the need of post-deposition annealing.

Having described various aspects of the present invention, the same will be explained in further detail in the following examples, which are included herein for illustration purposes only, and which are not intended to be limiting to the invention.

EXAMPLES

Having described various aspects of the present invention, the same will be explained in further detail in the following examples, which are included herein for illustration purposes only, and which are not intended to be limiting to the invention.

Example 1

Selective ALD of $Ru(EtCp)_2$ on $SiO_2$

A cyclopentadienyl-based precursor, $Ru(CpEt)_2$ (Strem Chemicals) precursor, with an $O_2$ co-reactant, was deposited at deposition temperature of 300° C. and a pressure of ~1 Torr on both $SiO_2$ and HF-cleaned Si substrates. Prior to deposition, samples were degreased and dipped in a 0.5% HF solution for 30 seconds, followed by an ultra-high vacuum anneal at 350° C. for 30 minutes to remove atmospheric contaminants. After deposition, samples were transferred without breaking vacuum to a UHV chamber for X-ray photoelectron spectroscopy (XPS, Scienta Omicron). 4-point-probe (Ossila Four-Point Probe System, Ossila, Ltd.) measurements were performed after deposition was completed. The film dimensions were 6 mm×2 mm with a probe spacing of 1.27 mm, which required in a geometric factor of 0.3443 being applied to the sheet resistance to correct for the proper sheet resistance due to the semi-infinite approximation being invalid. Finally, X-ray diffraction/reflectometry (XRD/XRR) were performed on the films to determine film thickness and grain structures.

The Ru precursor interacts with dissociatively adsorbed oxygen from the surface to oxidize precursor ligands and leave behind Ru metal. To ensure complete nucleation for the lowest resistivity Ru metal film, oxygen pulse was optimized for saturation (FIG. 1). The grain size was estimated using XRD peaks, and the higher oxygen dose with more complete nucleation resulted in larger grains consistent with the lower resistivity value. The grain size relationship for the $Ru(EtCp)_2$-deposited Ru films shows an Ru(002) dominant grain structure. While the Ru(002) grain size is roughly constant for the two oxygen dose conditions at 25 nm, the Ru(101) grain size average increases from 18.4 nm at 2 pulses/cycle to 28.0 nm at 4 pulses/cycle.

Figure 2:
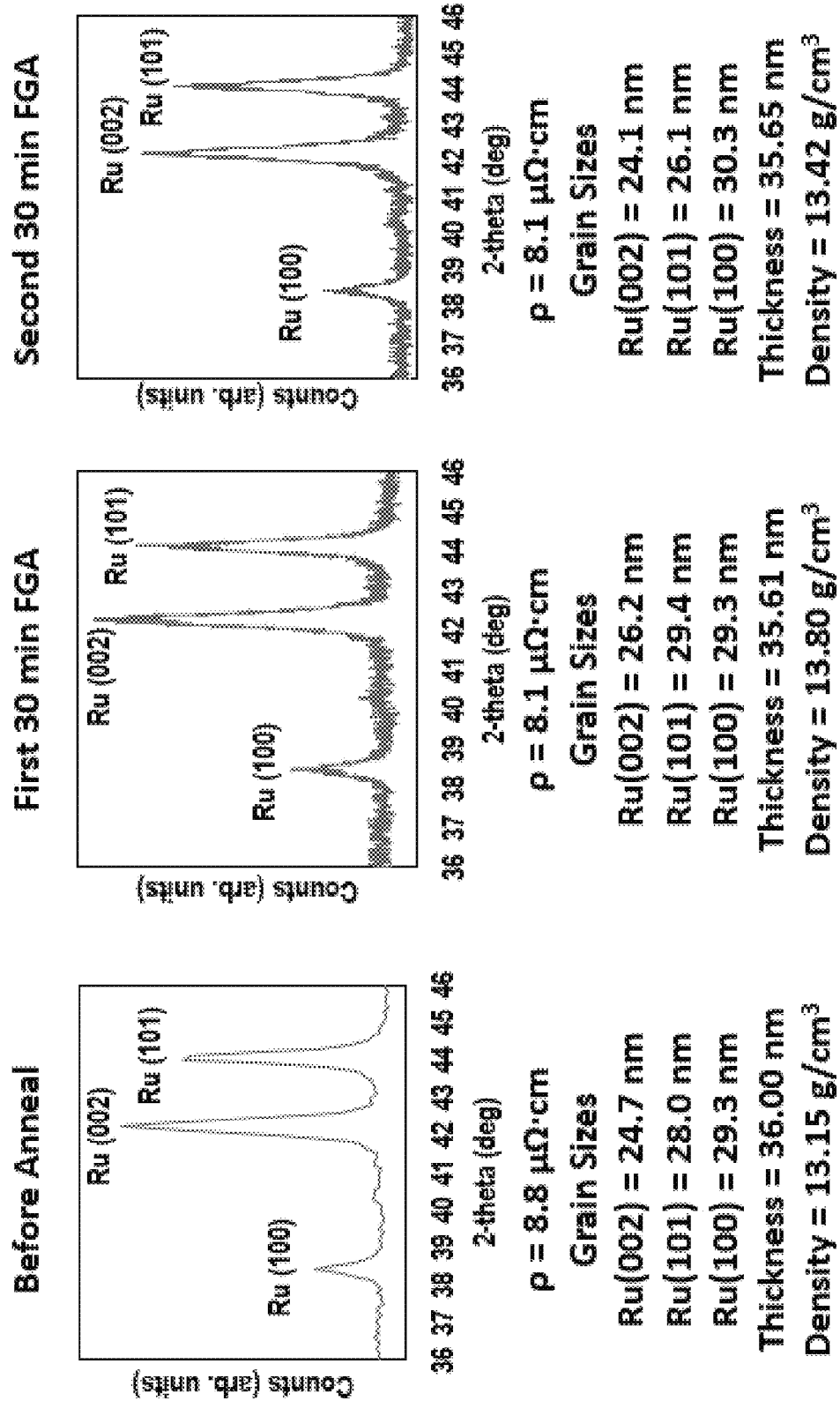
FIG. 2. Effects of FGA anneal on Ru ALD using $Ru(EtCp)_2$. After the first 30 minute FGA anneal, film resistivity reduced by 10% and density increased. Second FGA anneal had insignificant effects.

The effects of a post-deposition anneal on film resistivity was also examined. In FIG. 2, forming gas anneal was performed at 450° C. for 30 minutes twice to observe the effects of anneal on film resistivity. XRD and XRR was done at each step to observe film thickness and grain size. The first FGA anneal resulted in a denser film with a resistivity reduction of about 10%. The second FGA anneal did not result in any significant effect.

Figure 3:
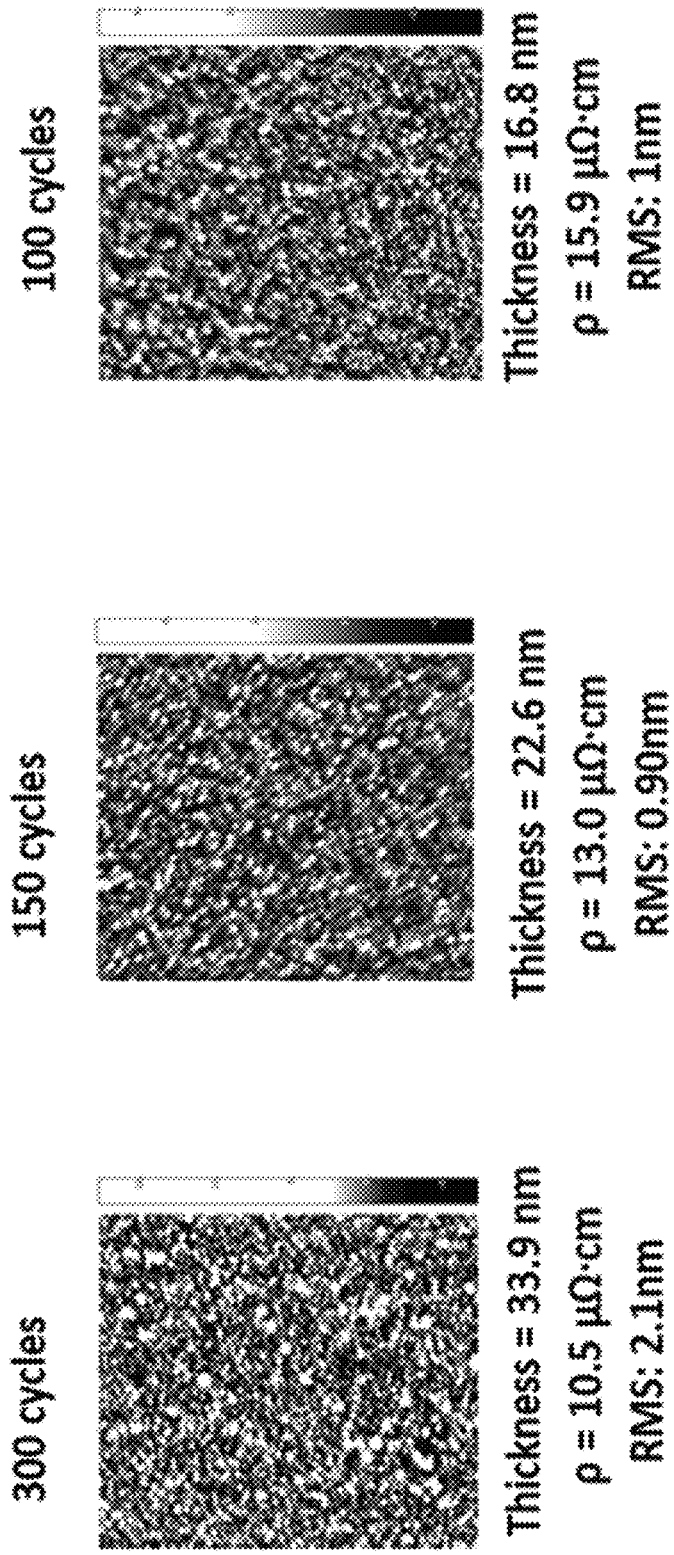
FIG. 3. Thickness-Resistivity relationship for Ru ALD using $Ru(EtCp)_2$. As films became thicker, resistivity decreased consistent with other results in literature. AFM and RMS roughness are also shown. Roughness also scales with film thickness.

Resistivity was studied as a function of film thickness via different ALD cycle number (FIG. 3). The film resistivity was observed to decrease as the film became thicker with more ALD cycles.

Figure 4:
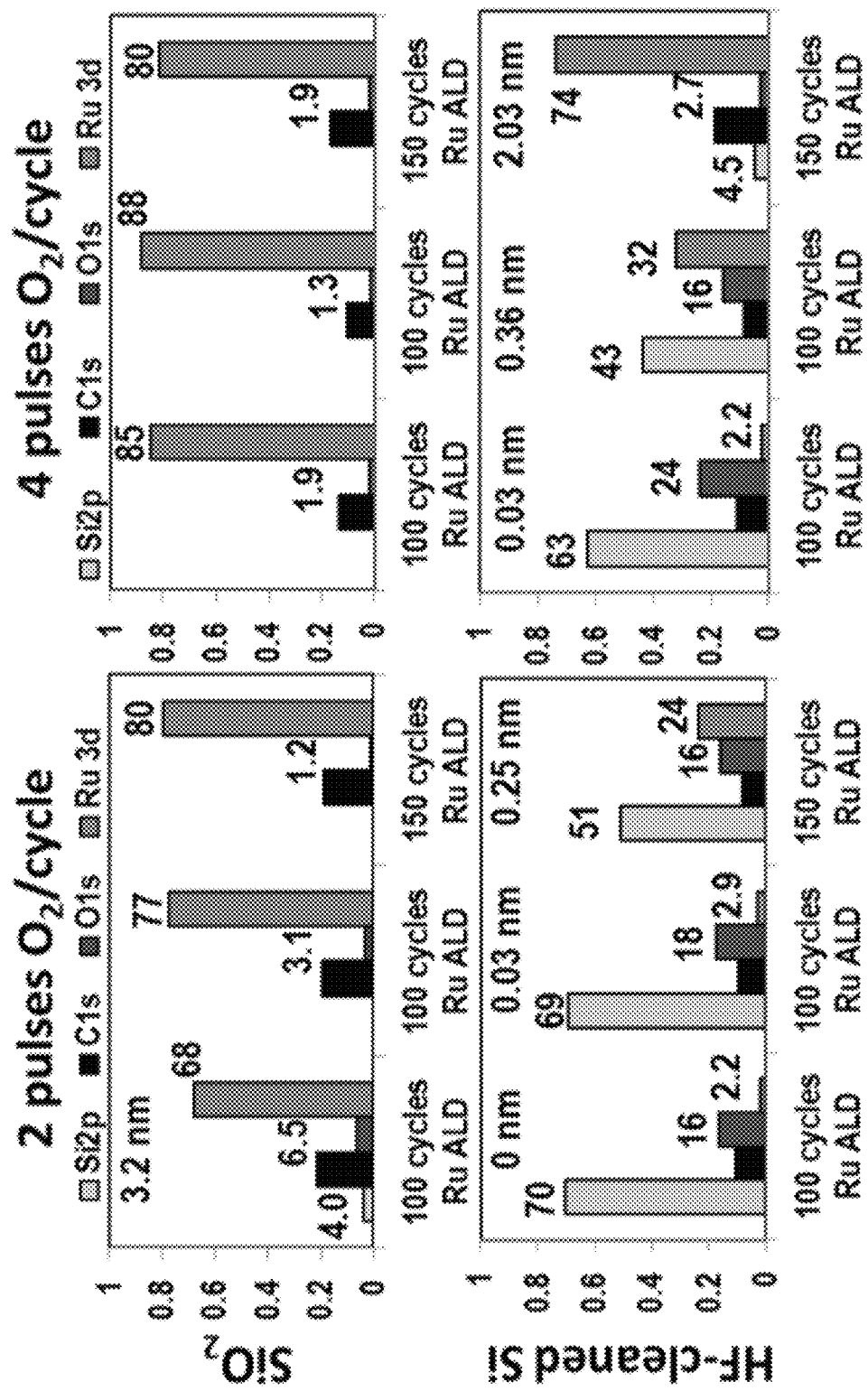
FIG. 4. Substrate selectivity during Ru ALD on $SiO_2$ and Si. At 300° C., 4 pulses/cycle $Ru(EtCp)_2$, and 2 pulses/cycle of $O_2$ (left), the first 100 cycles deposited results in a 3.2 nm Ru film on $SiO_2$, with a near-zero thickness on HF-cleaned Si. At the target of 350 cycles, only 0.25 nm was deposited on HF-cleaned Si despite XRR showing a 30 nm Ru film on $SiO_2$. Doubling the number of $O_2$ pulses to 4 pulses/cycle (right) increased the growth rate on HF-cleaned Si, but the growth rate remained significantly lower, with only 2 nm on Si after 350 cycles.

The lack of carbonyl groups on Ru(EtCp)$_2$ that can desorb readily gives finer control over the growth of the film at the cost of requiring finer control over oxygen dosing to ensure all cyclopentadienyl ligands are reacted away without further oxidizing and etching back the Ru film. The effect of increased oxygen dosing on resistivity and grain structure is illustrated in FIG. 4. After 350 cycles using 4 pulses per cycle of Ru(EtCp)$_2$ precursor, the film is fully buried with both 2 and 4 pulses per cycle of O$_2$ co-reactant on SiO$_2$. However, while growth of the film on SiO$_2$ was continuous and low-resistivity, the film on HF-cleaned Si was high-resistivity and XPS studies of the growth show a significantly slower growth rate on Si, indicating a highly selective Ru metal process with preference to SiO$_2$ over Si.

Attenuation of the substrate during XPS was used to estimate Ru thickness during the first 100 cycles, the next 100 cycles, and the final 150 cycles (FIG. 4). With 2 pulses of O$_2$/cycle, only 0.25 nm was deposited on HF-cleaned Si after 350 cycles. Doubling the O$_2$ dose to 4 pulses/cycle increased the growth rate on Si, yet selectivity remained high compared to SiO$_2$. In contrast and unlike previous reports of Ru selective ALD, no passivant was employed in the deposition process.

Example 2

Ru-Carish Conductivity and Grain Structure

Figure 5:
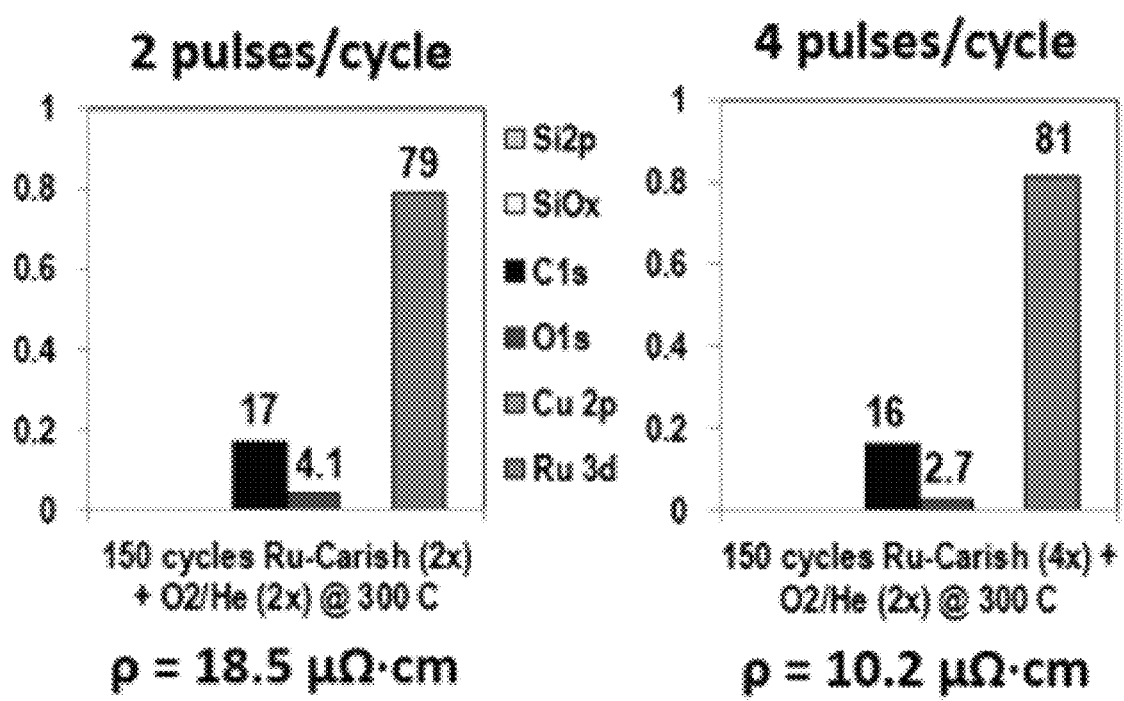
FIG. 5. Effect of the number of Ru-Carish pulses on Ru resistivity. At 300° C., after 150 cycles at 2 pulses per cycle of Ru-Carish (left), the film contains roughly 4.1% O, with a resistivity of 18.5 μΩ·cm. Doubling the number of pulses (right) reduces the percentage to 2.7%, with a decrease in resistivity to 10.2 μΩ·cm.

A study was performed to determine the effect of oxygen and grain size on Ru film resistivity. FIG. 5 illustrates the effect of Ru-Carish dose amount on the film resistivity and oxygen level. After 150 cycles, the film is fully buried with both 2 and 4 Ru-Carish pulses per cycle on both Si and SiO$_2$, but the resistivity on the film with 2 pulses/cycle was roughly 80% higher than with twice the Ru-Carish dose. Previous studies of Ru ALD using oxygen as co-reactants have observed that the mechanism of deposition with oxygen involves the presence of adsorbed oxygen, which when combined with additional Ru precursor can encourage more complete nucleation per cycle and lower oxygen content, decreasing film resistivity.

Figure 6:
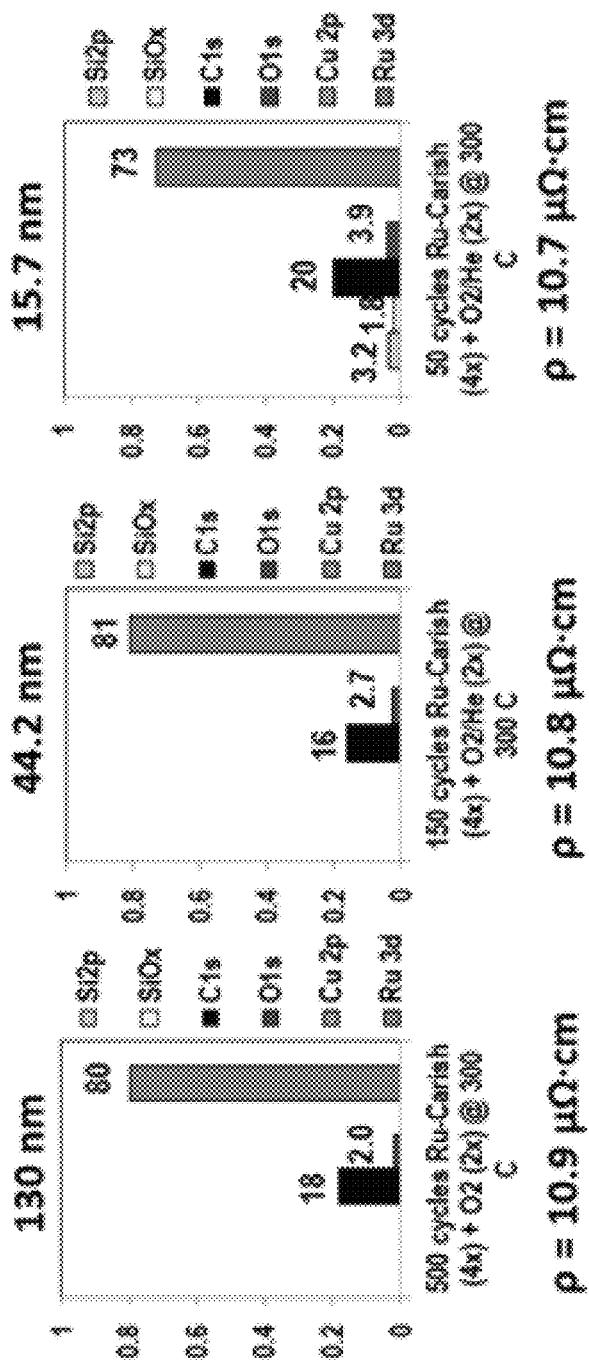
FIG. 6. Resistivity-thickness relationship for Ru ALD. At 300° C. and 4 pulses/cycle, the growth rate was determined to be 0.25 nm/cycle, with low oxygen persisting to 15.7 nm film thickness. Thickness measurement for the 130 nm film was performed via cross-sectional SEM, while thicknesses for the 44.2 and 15.7 nm films were determined via XRR. Four-point-probe resistance measurements showed resistivities of 10.9, 10.8, and 10.7 μΩ·cm, respectively.

FIG. 6 illustrates the relationship between film thickness and resistivity with 4 pulses per cycle. X-ray reflectometry (XRR) was used to determine film thicknesses for the thinner films (50 cycles and 150 cycles), while cross-sectional SEM was used to determine the 500 cycle film thickness. At 300° C. and 4 Ru-Carish pulses per cycle, the growth rate was determined to be roughly 0.25 nm/cycle, with low oxygen persisting down to a films thickness of 15.7 nm. Four-point-probe sheet resistance measurements showed resistivities of 10.9, 10.8, and 10.7 $\mu\Omega$·cm for 130 nm, 44 nm, and 16 nm films, respectively. Xray diffraction measurements show grain sizes for the Ru(101) crystal facets of 24.0, 20.8, and 28.9 nm for each film, respectively, using the Scherrer equation assumption of peak broadening.

Example 3

Selective Ru ALD Using Ru(IHD)(CO)$_2$ and Ru(EtCp)$_2$ Precursors

Figure 7:
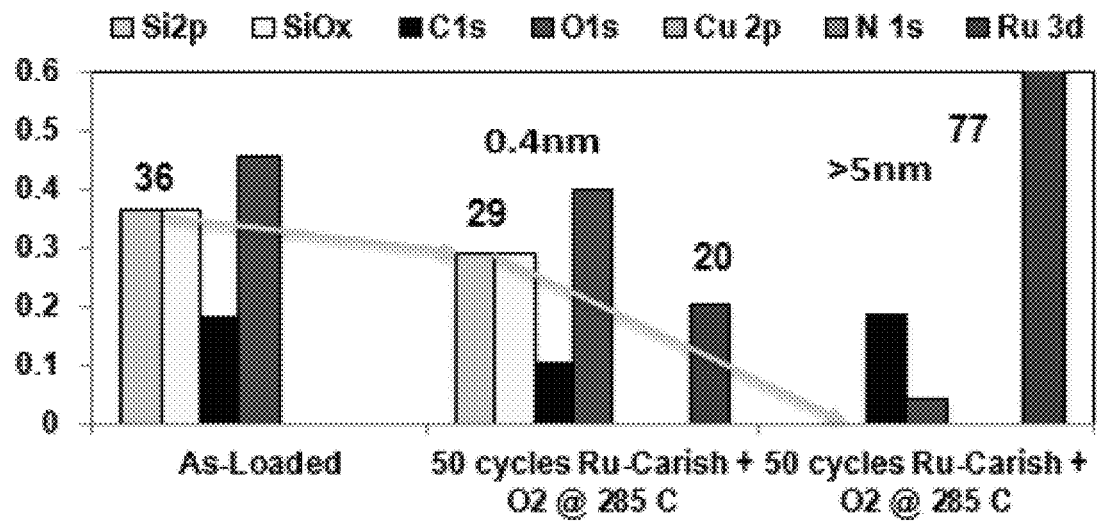
FIG. 7. Substrate selectivity during Ru-Carish ALD on $SiO_2$ and passivated $SiO_2$. XPS shows selectivity of the Ru-Carish process (2× Ru-Carish pulses/cycle, 4× $O_2$ pulses/cycle) in preference to $SiO_2$ (top) over DMADMS-treated $SiO_2$ (bottom).
Figure 7:
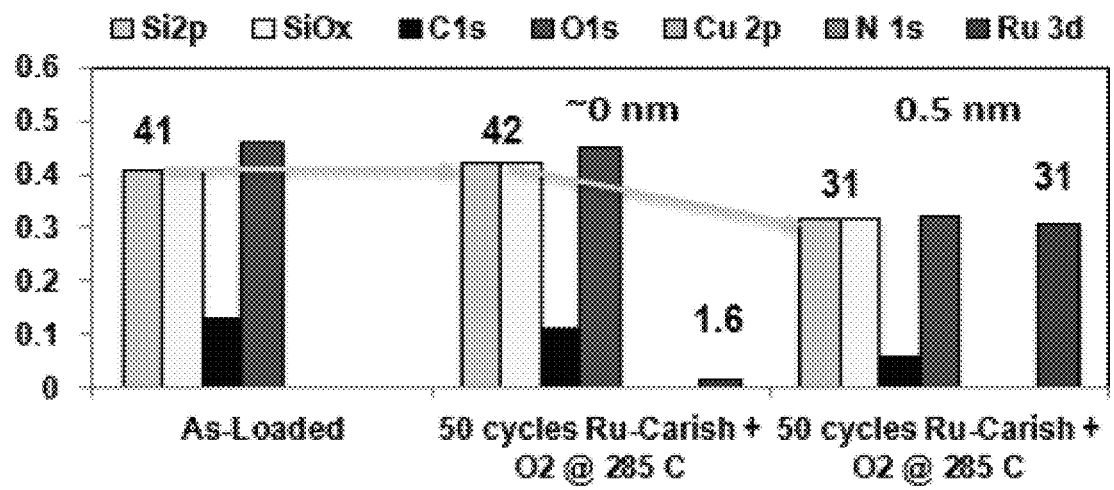
Figure 8:
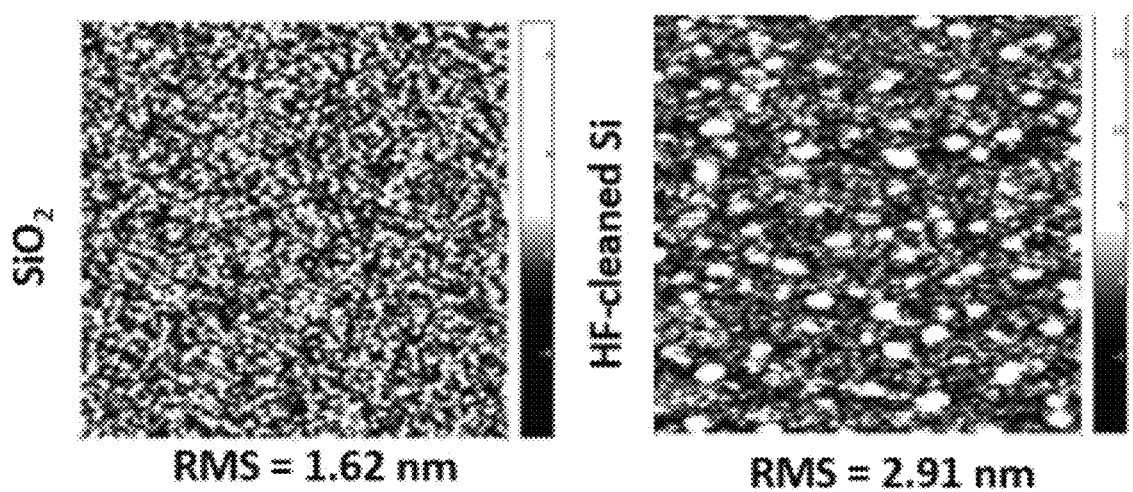
FIG. 8. No substrate selectivity during Ru-Carish ALD on $SiO_2$ and Si. AFM images show nucleation of Ru using the Ru-Carish process on both $SiO_2$ (left) and HF-cleaned Si (right) with higher RMS roughness on the HF cleaned Si sample. The large nuclei on the HF cleaned Si are consistent with low nucleation density on Si.

The two Ru metal ALD processes, Ru-Carish (Ru(IHD)(CO)$_2$)+O$_2$ and Ru(EtCp)$_2$+O$_2$, demonstrated different deposition selectivity between substrates. The Ru-Carish process exhibited selectivity with preferential nucleation on a SiO$_2$ sample over a DMADMS-passivated SiO$_2$ sample. In situ XPS shows that after 100 cycles of deposition, 5 nm of Ru was deposited on the untreated SiO$_2$ substrate while only 0.5 nm of Ru film was detected on the DMADMS-treated SiO$_2$ (FIG. 7). Selectivity was not observed when comparing deposition of Ru-Carish on HF-cleaned Si and untreated SiO$_2$. The AFM images in FIG. 8 show significant nucleation and a closed film on both substrates despite the RMS roughness being higher on the Si sample.

Figure 9:
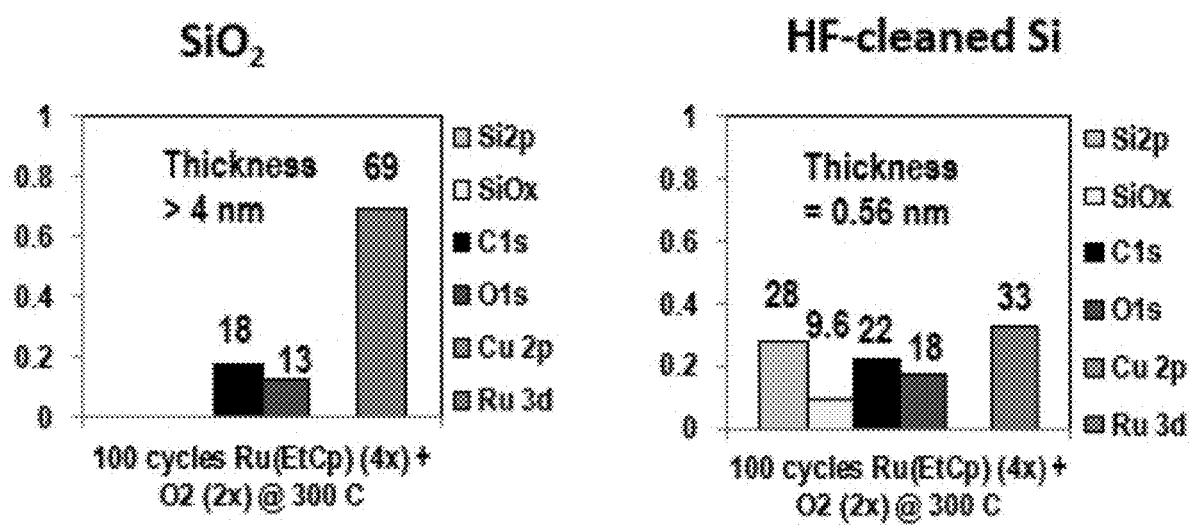
FIG. 9. XPS shows the $Ru(EtCp)_2$ process preferentially nucleating on $SiO_2$ over HF-cleaned Si.
Figure 10:
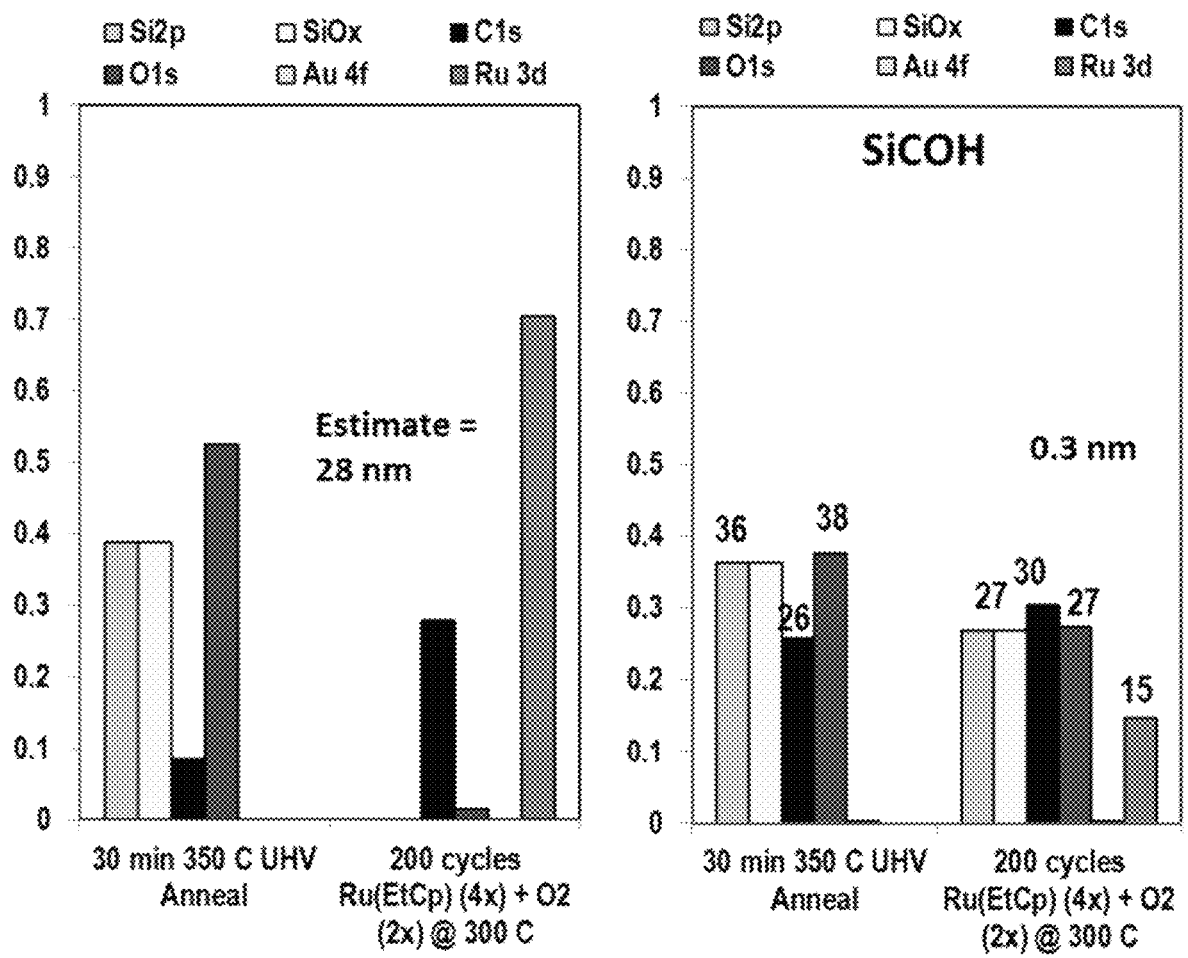
FIG. 10. XPS shows the $Ru(EtCp)_2$ process preferentially nucleating on $SiO_2$ over SiCOH.

The Ru(EtCp)$_2$ process exhibited selectivity on SiO$_2$ over HF-cleaned Si without passivants. After 150 cycles of deposition, in-situ XPS detected substrate signals from the HF-cleaned Si sample while the SiO$_2$ sample was buried by deposition (FIG. 9). Furthermore, four-point probe measurement showed that the HF-cleaned Si sample yielded too high of a resistance to measure, which is consistent with a lack of film closure. The deposited film on SiO$_2$ was found to be 22.6 nm from XRR while no signal was detected on the HF-cleaned Si. Similarly, selectivity was also shown on SiO$_2$ over SiCOH using Ru(EtCp)$_2$ as a precursor, with 28 nm deposited on SiO$_2$ and 0.3 nm on SiCOH after 200 cycles (FIG. 10).

Figure 11:
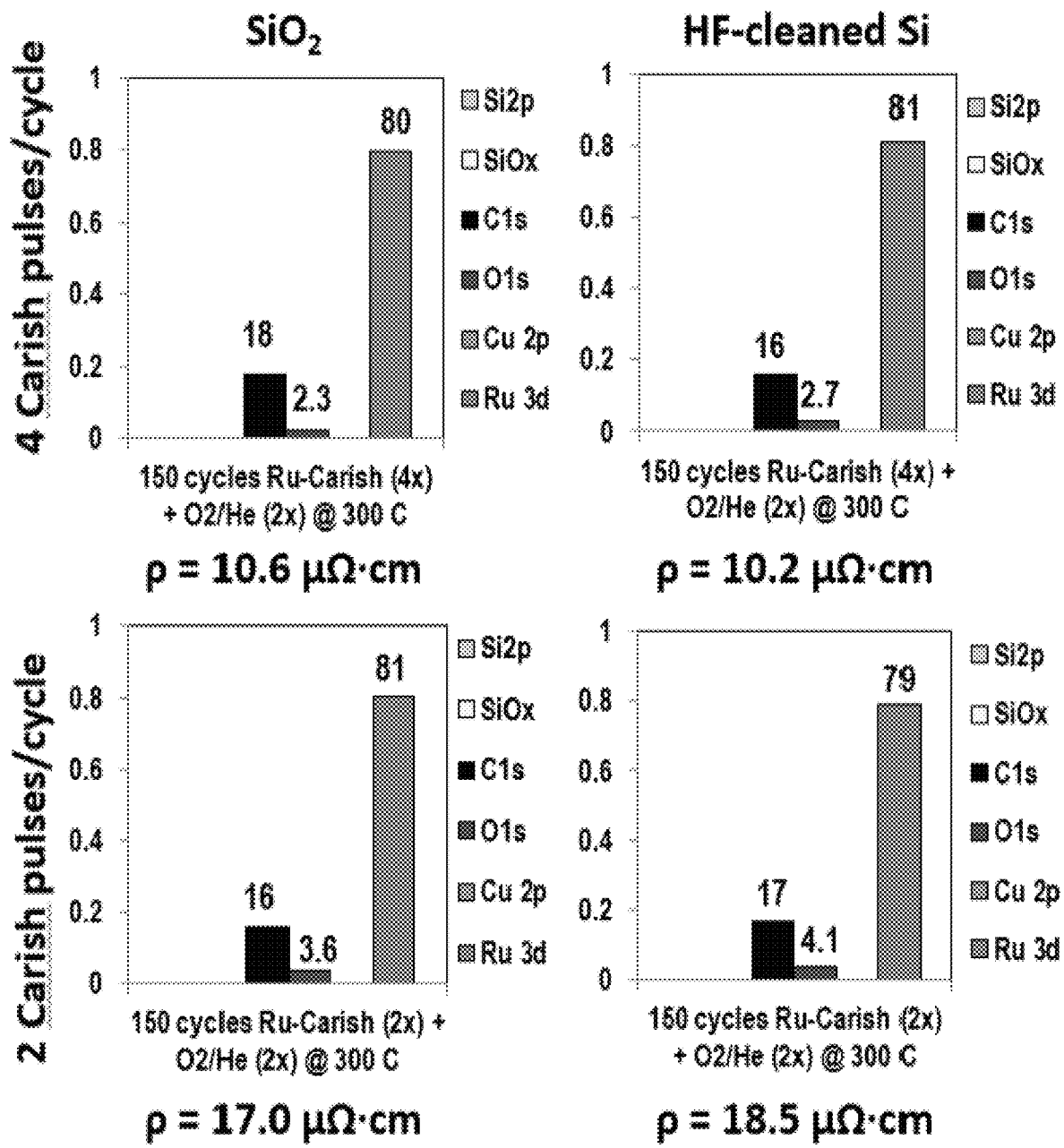
FIG. 11. XPS and four-point probe measurement results showing resistivity decrease with oxygen content. This is consistent with oxygen contamination.
Figure 12:
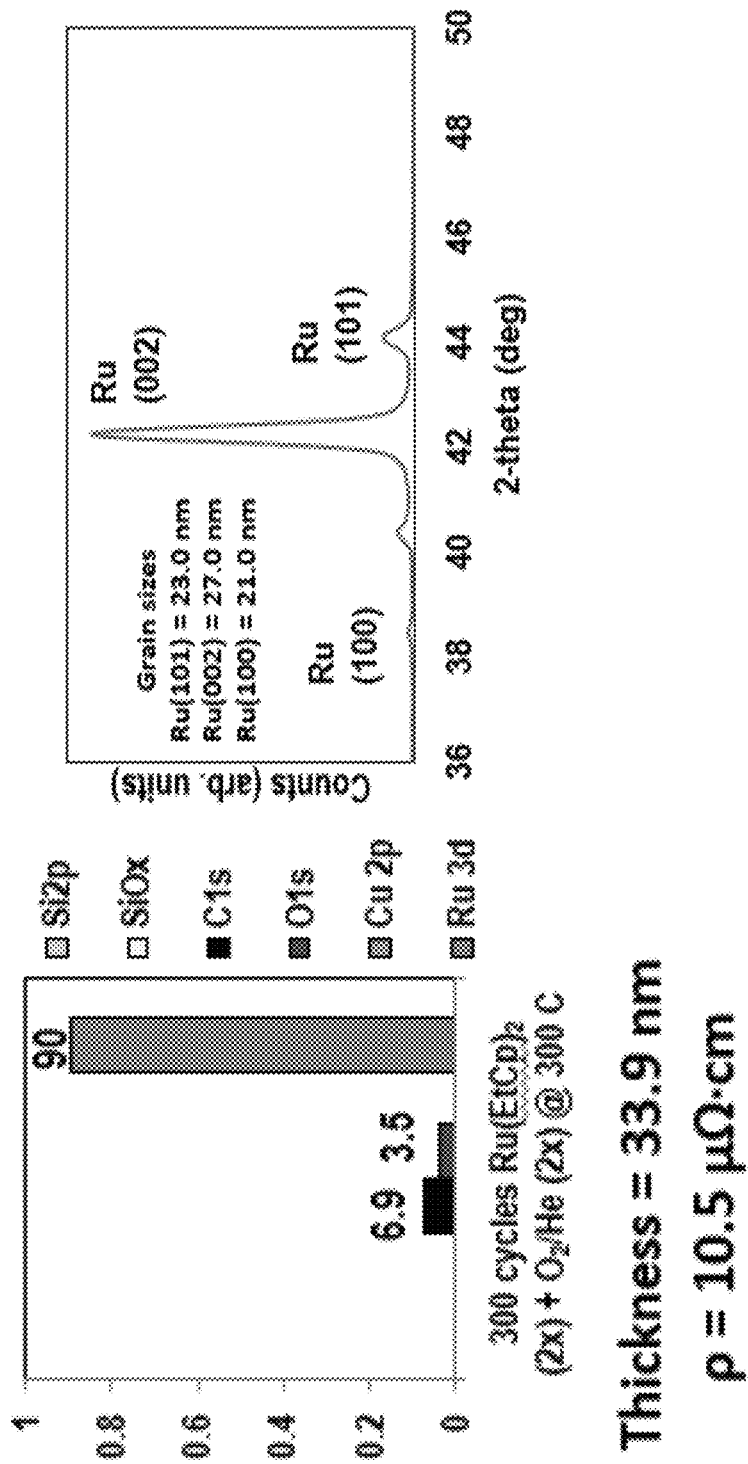
FIG. 12. XPS and XRD showing low resistivity and oxygen content and grain sizes for the $Ru(EtCp)_2$ process. Large grain sizes are indicative of low resistivity due to having less grain boundaries throughout the film.
Figure 13:
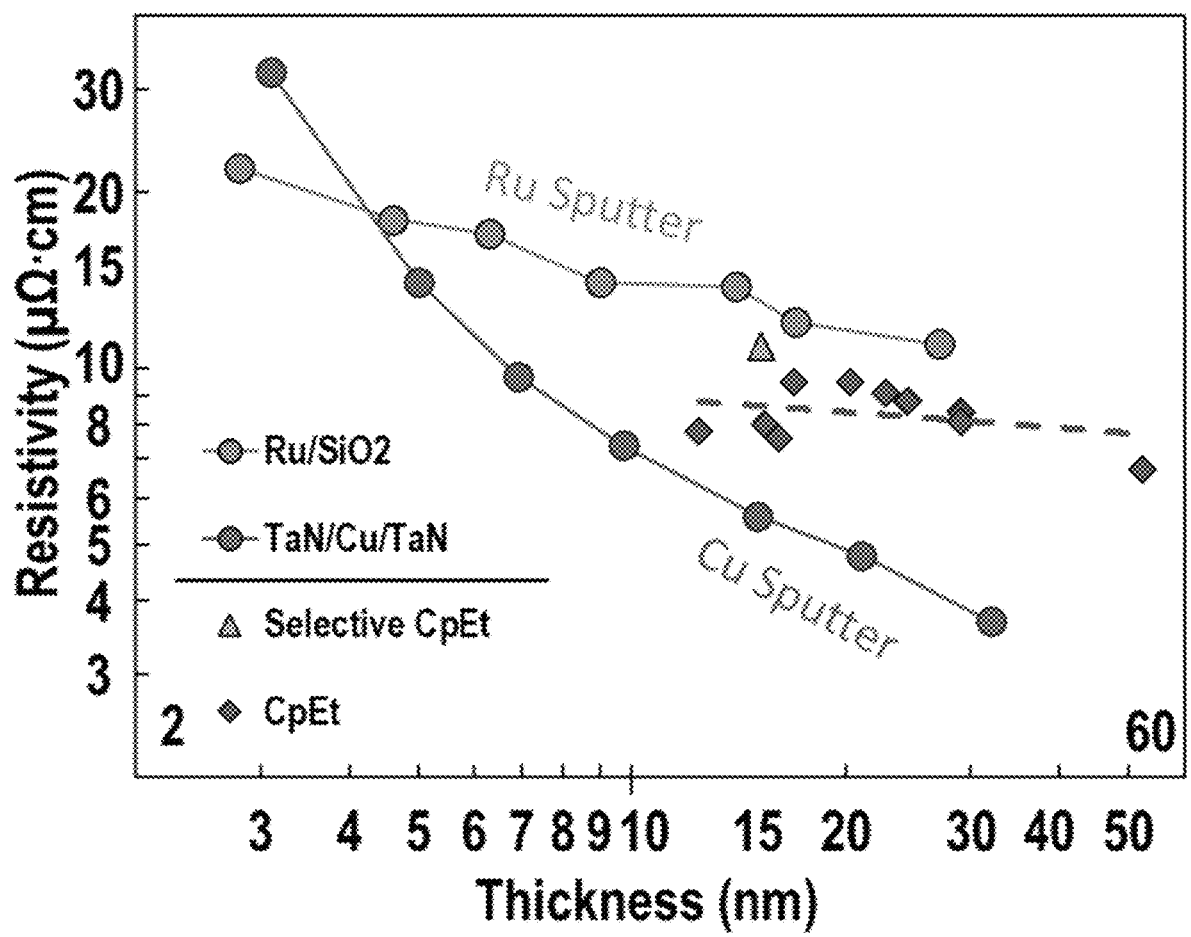
FIG. 13. Film thickness-resistivity relationship showing low resistivity for the $Ru(EtCp)_2$ process of the inventive concept (diamonds and triangle) in comparison with conventionally sputtered Ru (circles).

In addition to demonstrating selectivity, both the Carish and Ru(EtCp)$_2$ ALD processes formed low resistivity films when the oxygen content of the film was kept low. This trend can be seen when the oxygen in the deposited film was controlled by varying the Ru-Carish dosage. By pulsing more of the Ru-Carish precursor, the oxygen content is lowered, as well as the resistivity of the resulting deposited film as shown in FIG. 11. After scaling thickness, the Ru-Carish process yielded a resistivity value of 10.3 $\mu\Omega$·cm from a 29.7 nm film on SiO$_2$ with 2.4% oxygen without PDA. Similarly, the Ru(EtCp)$_2$ process has also yielded low resistivity films with low oxygen content. A resistivity value of 10.5 $\mu\Omega$·cm was measured for a 22.6 nm film with 3.5% oxygen without PDA on SiO$_2$ (FIG. 12). Resistivities and thicknesses of Ru(EtCp)$_2$ films prepared by the ALD processes described herein (diamonds and triangle), compared to conventionally Ru-sputtered and Cu-sputtered films (circles, see, Dutta et al. (2017). J. Appl. Phys. 122, 025107) are shown in FIG. 13. The Ru metal films prepared by the ALD processes described herein exhibit lower resistivity at comparable film thickness than conventionally prepared Ru metal films. The observed relation between oxygen content and resistivity is consistent with oxygen contamination in the metal film forming grain boundaries, which can increase the film resistivity. The Ru(EtCp)$_2$ ALD processes are the first Ru ALD processes to be highly selective in deposition without a passivant and are consistent with Ru ALD needing oxygen on the starting surface in order to dissociate the Ru(EtCp)$_2$ precursor.

While specific embodiments of the present inventive concept have been shown and described, it should be understood that other modifications, substitutions, and alternatives are apparent to one of ordinary skill in the art. Such modifications, substitutions and alternatives can be made without departing from the spirit and scope of the invention. Various features of the inventive concept should be determined as set forth from the appended claims.

That which is claimed:

1. A method for atomic layer deposition (ALD) of Ruthenium (Ru) on a substrate comprising at least one cycle of:
    exposing a surface of a substrate to a chemical precursor comprising Ru, the surface comprising an SiO$_2$ portion and an SiCOH portion;
    depositing the chemical precursor on the surface of the substrate; and
    exposing the chemical precursor on the surface of the substrate to a co-reactant, to provide an Ru film on the surface of the substrate,
wherein substrate is maintained at a temperature of greater than about 250° C. while performing the at least one cycle, and the Ru film is deposited selectively on the $SiO_2$ portion of the surface but not over the SiCOH portion of the surface;
wherein the chemical precursor comprises $Ru(EtCp)_2$, and the co-reactant comprises $O_2$;
wherein the Ru film has a resistivity less than about 9.5 µΩ·cm, and wherein the Ru film is prepared without a post-deposition annealing process.

2. The method of claim 1, wherein exposing the surface of the substrate to the chemical precursor comprises at least 2-4 pulses of the chemical precursor per cycle.

3. The method of claim 1, wherein exposing the chemical precursor on the surface of the substrate to the co-reactant comprises at least 2-4 pulses of the co-reactant per cycle.

4. The method of claim 1, wherein the Ru film provided has a thickness of at least about 30 nm.

5. The method of claim 1, wherein the Ru film provided comprises an average grain size of at least about 24 nm.

6. An interconnect or a semiconductor device comprising the Ru film of claim 1.

7. A method for ALD of Ru on a substrate comprising at least one cycle of:
exposing a surface of a substrate to a chemical precursor comprising $Ru(EtCp)_2$, the surface comprising an $SiO_2$ portion and an SiCOH portion;
depositing the chemical precursor on the surface of the substrate; and
exposing the chemical precursor on the surface of the substrate to a co-reactant comprising $O_2$, to provide an Ru film on the surface of the substrate,
wherein the substrate is maintained at a temperature in a range of about 250° C.-450° C. while performing the at least one cycle, and the Ru film is deposited selectively on a surface of the $SiO_2$ portion of the surface but not over a surface of the SiCOH portion of the surface; and
wherein the Ru film has a resistivity less than about 9.5 µΩ·cm, and wherein the Ru film is prepared without a post-deposition annealing process.

8. The method of claim 7, wherein the Ru film has a resistivity in a range of about 7-9.5 µΩ·cm.

9. The method of claim 7, wherein the Ru film is deposited selectively on the $SiO_2$ portion when the surface of the SiCOH portion of the substrate is free of a passivant.

10. The method of claim 7, wherein the Ru film deposited on the surface of the $SiO_2$ portion of the substrate is at least about 20 nm, and wherein the Ru film on the surface of the SiCOH portion of the substrate is less than about 2 nm.

11. The method of claim 10, wherein the Ru film on the surface of the SiCOH portion of the substrate is less than about 0.5 nm.

12. An interconnect or a semiconductor device comprising the Ru film of claim 7.

* * * * *